US010197372B2

United States Patent
Grace et al.

(10) Patent No.: US 10,197,372 B2
(45) Date of Patent: Feb. 5, 2019

(54) IGNITION GENERATOR FOR INSENSITIVE AND TAILORABLE EFFECTS, AS A WARHEAD INITIATOR

(71) Applicant: ENIG ASSOCIATES INC., Bethesda, MD (US)

(72) Inventors: Fred Irvin Grace, York, PA (US); Michael J. Barnard, Laurel, MD (US); Daniel Bentz, Derwood, MD (US); Eric N. Enig, Bethesda, MD (US); Kim Yilbong, Silver Spring, MD (US)

(73) Assignee: ENIG ASSOCIATES INC., Bethesda, MD (US)

( * ) Notice: Subject to any disclaimer, the term of this patent is extended or adjusted under 35 U.S.C. 154(b) by 0 days.

(21) Appl. No.: 15/315,832

(22) PCT Filed: Jun. 5, 2015

(86) PCT No.: PCT/US2015/034398
§ 371 (c)(1),
(2) Date: Dec. 2, 2016

(87) PCT Pub. No.: WO2016/028361
PCT Pub. Date: Feb. 25, 2016

(65) Prior Publication Data
US 2017/0191814 A1    Jul. 6, 2017

Related U.S. Application Data

(60) Provisional application No. 62/008,213, filed on Jun. 5, 2014.

(51) Int. Cl.
*F42C 19/12* (2006.01)
*F42B 3/10* (2006.01)
(Continued)

(52) U.S. Cl.
CPC ............ *F42C 19/12* (2013.01); *F42B 3/10* (2013.01); *F42C 11/04* (2013.01);
(Continued)

(58) Field of Classification Search
CPC ....... F42C 19/12; F42C 11/04; F42C 19/0846
(Continued)

(56) References Cited

U.S. PATENT DOCUMENTS

| 3,356,869 A | 12/1967 | Hilton et al. |
| 4,334,474 A | 6/1982 | Coltharp |

(Continued)

FOREIGN PATENT DOCUMENTS

EP    0675262    10/1995

OTHER PUBLICATIONS

Datasheet Blue Chip Detonator, Excelitas Technologies, 2013, pp. 1-4.
(Continued)

*Primary Examiner* — Joshua E Freeman
(74) *Attorney, Agent, or Firm* — Browdy and Neimark, P.L.L.C.

(57) ABSTRACT

An explosive device composed of: a flux compression generator operative to produce a high intensity electric current when activated; and an electrical payload connected to the generator and constructed to receive the high intensity electric current and cause energy in the current to generate a plate or shaped projectile in the payload and to launch the projectiles into an explosive or insensitive reactive material target for the purpose of initiating the reactive material at single or multiple points.

20 Claims, 4 Drawing Sheets

(51) Int. Cl.
  *F42C 11/04* (2006.01)
  *F42C 19/08* (2006.01)
  *H03K 3/53* (2006.01)
  *F42C 15/00* (2006.01)

(52) U.S. Cl.
  CPC ...... *F42C 19/0842* (2013.01); *F42C 19/0846* (2013.01); *H03K 3/53* (2013.01); *F42C 15/00* (2013.01)

(58) Field of Classification Search
  USPC .................................................. 102/202.14
  See application file for complete search history.

(56) References Cited

U.S. PATENT DOCUMENTS

| | | | |
|---|---|---|---|
| 4,370,576 A | | 1/1983 | Foster et al. |
| 4,753,153 A | * | 6/1988 | Jasper, Jr. ............... F41B 6/006 124/3 |
| 9,658,026 B1 | | 5/2017 | Grace et al. |

OTHER PUBLICATIONS

Department of Defense Design Criteria Standard, Fuze Design, Safety Criteria for, MIL-STD-1316E, Jul. 10, 1998, pp. iii-iv and 1-20.
Excelitas Technologies, Electronic Safe, Arm and Fire Devices and Modules, 2015, p. 1.
Fowler, et al., Magnetic Flux Compression Generators: a Tutorial and Survey, Electromagnetic Phenomena, 2003, pp. 305-357, V.3, 33 (11).
Fowler, et al., Production of Very High Magnetic Fields by Implosion, Journal of Applied Physics, Mar. 1960, pp. 588-594, vol. 31, No. 3.
Gibbs, et al. LASL Explosive Property Data, University of California Press, 1980, pp. v and 234-235.
Goforth, et al., The Ranchero Explosive Pulsed Power System, 11th IEEE International Pulsed Power Conference Hyatt Regency, Baltimore, MD, Jun. 29-Jul. 2, 1997, pp. 1-9.
Goldwasser, Dr. Judah, Reactive Material Structures (RMS), DARPA, Defense Sciences Office, Apr. 2015, p. 1.
Simon Kassel, Pulsed-Power Research and Development in the USSR, A Report prepared for Defense Advanced Research Projects Agency, May 1978, pp. iii-xii and 1-148.
Neuber, et al., Compact High Power Microwave Generation, Proceedings of the Army Science Conference (26th), Orlando, Florida Dec. 1-4, 2008, pp. 1-9.
Ordnance Explosive Train Designers' Handbook, United States Naval Ordnance Laboratory, Apr. 1952, pp. 6-1 and 6-2.
RP-95 EFI Detonator P/N. 188-7373, before Jun. 1, 2015, p. 36.
Weihs, T.P., Fabrication and characterization of reactive multilayer films and foils, Johns Hopkins University, 2014 Woodhead Publishing Limited, Chapter 5, pp. 160-242.

* cited by examiner

Fig. 8

IGNITION GENERATOR FOR INSENSITIVE AND TAILORABLE EFFECTS, AS A WARHEAD INITIATOR

BACKGROUND OF THE INVENTION

The present invention relates to fuse/safe-and-arm/booster charge devices containing a flux compression generator (FCG) for producing a high current that drives a flying mass as a slapper, flying plate, or jet penetrator into explosives of a warhead or munition or to activate a hot wire so as to initiate and sustain a high level detonation in the insensitive high explosive or reactive materials contained therein.

At present, there are no methods to efficiently initiate or ignite relatively insensitive high explosives, propellants, or reactive materials, referred to as a whole as insensitive reactive materials. Conventional techniques use large powerful booster explosives to "boost" the final stage of an explosive train to obtain a complete and reliable reaction initiation in the main explosive fill when insensitive explosives are used for that fill. The need for such large systems stems from the very nature of the insensitive explosives that are designed by synthesis to guard against accidental initiation by exterior stimuli and render safe a munition or rocket motor. Such stimuli may include mechanical shock and impact, response to stray electrical power, and high temperature environments that are often encountered during storage, transportation and end use. The large boosters, having relatively sensitive explosives, present large vulnerable volumes to the stimuli and as such compromise the safety of the entire warhead and degrade from the intent of using insensitive materials for main munition fill. A compact device not having a large booster system but capable of reliably initiating insensitive material based on flux compression generator technology can vastly improve overall safety of the warhead system.

Further, when reactive materials are used as the fill or as structural components of munitions, there is a need to consume the materials at a very high rate. Since these materials have slow burn rates it may be necessary to use multiple ignition sites to vastly reduce total time for the entire combustion of the structure. Such electrical system could require a large capacitor bank that cannot easily be contained within the munition.

Various fusing techniques have been used in the past to initiate high explosives in munitions, such as described in Ordnance Explosive Train Designers' Handbook, NOLR 1111, 1952. A standard approach uses an explosive train involving an electric detonator that contains a small amount of highly sensitive explosive material (primary explosives) in a detonator, an intermediate sensitive explosive pellet, and a relatively large booster explosive having a contact interface with the main explosive fill (secondary explosives). Conventional secondary explosives, while less sensitive than primary explosives are considerably more sensitive than tertiary or insensitive explosives. In the explosive train, when the detonator is energized, it ignites the explosive within the detonator, which in turn initiates the explosive pellet, which in turn initiates a relatively large booster explosive, which in turn initiates the explosive fill. In this example, each explosive component in the train is sequentially less sensitive, allowing a build-up of energy as the train functions until finally the main explosive is initiated. In this system, the most sensitive explosives are smaller while the lesser sensitive explosives are larger. Thus, the small size of the sensitive material minimizes the vulnerability of a component to accidental function in response to environmental stress such as shock impact, stray electrical fields, and/or high temperature environments that can set off explosive materials.

Reactive materials can be initiated using the hot wire technique and in some cases shock from detonated explosives. Since use of reactive materials, and in particular difficult to ignite metal-metal oxide reactions, is now being contemplated, it likely will be necessary to supply large amounts of energy for reliable initiation of these materials, particularly when multiple point initiation is desired.

Generally, in application, a munition is designed to detonate upon a proper command that starts the sequence associated with the explosive train. For example, if the munition needs to be detonated upon impact with a given target, then the munition will be activated when an associated frontal switch is closed upon impact with that target, which in turn discharges current from an on-board capacitor or battery carried in the munition into the detonator to begin the sequence.

When using an explosive train, a serious concern relates to use of a detonator and its activation switch that are most vulnerable to accidental function when subjected to unwanted external stimuli. For example, if the munition were to be dropped accidentally during transport, then the switch could close and result in an undesired munition detonation. Further, even if the switch did not close, the detonator might see sufficiently high stress from the impact, causing its sensitive material to react. If the detonator functions, on purpose or not, the entire train is activated with a resulting detonation of the main charge. Consequently standard fusing uses an "out-of-line" mechanical technique wherein the detonator itself or the combination of the detonator and explosive pellet are place out of line relative to the rest of the explosive train and considered in the "safe" position. The detonator is brought "in line" only under very restrictive conditions related to some other aspect of the weapon system. If the munition were a projectile fired from a rifled barrel, then known levels of setback and rotational acceleration can be used to allow the detonator to be aligned with the rest of the explosive train after some desired time delay. Once aligned, the fuse is considered to be in the "armed" position. The time delay assures that the munition is not armed until the munition has traveled a safe distance from the gunner.

A more recent example of initiation is use of a slapper detonator to initiate munition fills directly with fewer elements in the explosive train (reference: www.teledynerisi.com RP-95 EFI Detonator Data Sheet, Excelitas Technologies, incorporated herein by reference.). The slapper detonator includes a secondary explosive element Hexanitrostilbene (HNS) that in turn ignites the secondary explosives of the main fill. This system uses an exploding wire technique powered by electrical energy and as such propels a Mylar or PTE film or metallic foil across a small gap at very high velocity to impact the fill. The high velocity impact generates sufficiently high pressure to initiate the secondary explosive element. Although the slapper detonator is relatively small (0.5 inch diameter), it requires a high voltage electrical source such as a highly charged capacitor. When used as an initiator in a munition, a fuse switch and out of line techniques can be used to provide a safe system.

With the advancement of microcircuits, a development of superior fusing based on "in-line" systems known as Electronic Safe Arm and Fire (ESAF) has been realized as state of the art technology (reference: www.excelitas.com Electronic Safe, Arm and Fire Devices and Modules, incorporated herein by reference.). In these systems, when a slapper detonator is used for example, the slapper detonator is in direct contact with the main explosive fill while the electronics provide the "safe and arm" functions. Such in-line systems meet reliability and safety requirements as set forth in Military Standards for fusing (reference: MIL-STD-1316E, Fuze Design, Safety Criteria for DOD, 10 Jul. 1998, incorporated herein by reference).

Tertiary insensitive high explosives require a substantial increase in energy over traditional secondary explosives to initiate and sustain detonation. Criteria for initiation relates to the "failure diameter" associated each explosive type. Conventional explosives typically have failure diameters ranging from sub-millimeters for primary explosives to one-half centimeter for secondary explosives like Comp B, while those for insensitive materials like TATB derivatives, Baratol, and Destex can range from 2.0 centimeters or more (reference: T. R. Gibbs and A. Popolato, Eds., LASL EXPLOSIVE PROPERTY DATA, University of California Press, Berkley, CA, 1980, incorporated herein by reference). The notion relates to long cylinders of explosives, wherein several of varied radii are detonated or attempted to be detonated. Below a certain diameter (failure diameter) the detonation fails to propagate. It is easily seen based on the previously mentioned failure diameters that an order of magnitude more energetic initiation schemes must be developed to reliably initiate insensitive munitions. These required levels of energy reduce the probability significantly that environmental stress or external stimuli can produce an undesired event in munitions that use insensitive reactive materials. Thus, use of insensitive munitions and explosive fills in munitions is an effective strategy to render weapons that are far safer than before.

Given that the energy density is rather uniform over the explosive surface related to the diameter, it can be noted that the energy required to sustain detonation increases exponentially with failure diameter. Thus, insensitive high explosives are difficult to initiate and require significantly larger booster explosives for initiation. A slapper detonator system using the secondary explosives HNS as booster explosives, for example, would need to be significantly larger. Then, the secondary booster of the slapper detonator becomes significantly more vulnerable due to its size. Having such detonator to initiate the insensitive explosive fill, or such detonators distributed throughout the main explosive fill as a multipoint initiation scheme introduces increased vulnerability for the entire munition and significantly reduces the benefit of using insensitive tertiary explosive fills.

The vulnerability of the slapper detonator booster could be reduced through use of insensitive explosives as its booster material. However, the slapper detonator's Mylar or metallic foil projectile would then need to be more massive, propelled to higher velocity, and more energetic. As such, the energy required for the projectile increases directly with mass and with the square of velocity. Consequently, for adequate function, a reduced vulnerability slapper detonator system using a booster of insensitive explosives would require a significantly greater energy source and therefore a much larger capacitor.

Another class of insensitive materials that are of interest is reactive materials that can have energy outputs as high a 4 to 5 times TNT explosives. These include both combustion types that produce gaseous products such as Aluminum/Teflon and heat producing types such as the solid-state reaction of metal/metal oxides like the Fe/A10 "thermite." Some of these materials can have quality structural properties and are finding use as replacements for steel used as munition casings (Reference: J. Goldwasser, DARPA DSO, www.darpa.mil/Our_Work/DSO/Programs Reactive_Material_Structures_(RMS).aspx, April 2015, incorporated herein by reference). As such, the casing also can react, producing greater munition output in terms of energetic fragments and/or increased blast, for example. Another option is to replace both explosives and casings with a solid billet of reactive material to obtain significantly greater munition output.

A conventional means used to initiate reactive materials is a "hot wire technique" wherein an embedded resistive element (Nichrome wire) is Joule heated using electrical current above the reaction temperature of the reactive material. Typically, a current density of 1000 Joules per cubic centimeter is required for initiation (reference, T. P. Weihs, Johns Hopkins University, Woodhead Publishing Limited, Chapter 5, p. 160, 2014, incorporated herein by reference), which could imply some 0.5 Ampere for 2 seconds. A drawback of using reactive materials in munitions is that the reaction propagation rate is low, typically being from 1 to 100 m/s whereas explosives have rates on the order of 6000 to 9000 m/s. Although the energy release is high, the low rate precludes use as a high peak pressure mechanism to overcome stress levels required to damage targets.

The present invention having large current output can significantly reduce the reaction time by initiating the reactive materials at many sites within the structure or billet. For example, if the reaction rate were 10 m/s, then reaction time to consume a 1-meter long column of reactive material would be 100 milliseconds. When 100 equally spaced initiators are used, then each reaction only needs to propagate 0.005 meter to consume the entire length in 0.5 millisecond. Such multipoint initiation reduces time for total consumption and produces a far shorter blast pulse with a correspondingly higher peak pressure in the blast field. To accomplish this task conventionally, with energy stored in a reasonably sized capacitor, would require highly sensitive incendiary material to be spread throughout the bulk of the structure or billet, greatly increasing the vulnerability of the munition. The present invention in compact form can supply the required electrical energy to initiate the reactions at single or multiple initiation sites.

Since the energy required is beyond that provided by conventional initiation techniques, devices based on traditional techniques have not been able to reliably initiate insensitive high explosives or reactive materials with a reasonable size device. To provide sufficient energy, the initiation devices would need to be scaled to much larger size (large booster) for an explosive train or would need to contain large electrical storage devices (capacitors) to power the slapper detonator or hot wires. A shaped charge of large size could be used to provide a sufficiently energetic jet but because of the large explosive mass, it would have vulnerabilities similar to large boosters. The slapper detonator contains secondary explosives that have inherent vulnerabilities. Use of these at multiple initiation sites would distribute such secondary explosives, being more sensitive than insensitive reactive materials, throughout the insensitive munition fill. Explosive trains or boosters located at each one of the multiple sites would use up too much volume and increase the risk that accidental initiation or ignition could take place. Further, once the shaped charge or explosive train is initiated accidentally, the jet or booster would initiate the main insensitive explosives without a means to prevent its function.

Flux compression generators (FCGs) are already known in the art. An example thereof is disclosed in U.S. Pat. No.

4,370,576, issued to J. S. Foster, Jr., on Jan. 25, 1983, and the entirety of which is incorporated herein by reference. Further, FCG coupled with an electrical load to form jets and penetrators has been described in U.S. patent application Ser. No. 13/949,849, entitled Explosive Device Utilizing Flux Compression Generator, Grace et al, filed on 24 Jul. 2013, and the entirety of which is incorporated herein by reference.

A flux compression generator is a device that converts explosive energy directly to electrical energy. Although various geometries have been explored (reference: C. M. Fowler and L. L. Altgilbers, "Magnetic Flux Compression Generators: a Tutorial and Survey," *Journal of Electromagnetic Phenomenon*, 3 (11), 2003, pp. 305-357, incorporated herein by reference.), a cylindrical geometry has attractive features for warhead and munition applications since these devices generally also have a cylindrical geometry. Of these, two types have been advanced and are known as "coaxial" and "helical" generators, respectively (reference: Fowler and Altgilbers, supra). However, the present invention can operate using any FCG geometry.

An FCG consists of a cavity having axially spaced input and output ends and enclosed by electrically conductive material such as metal, and a means, such as explosives, to collapse the cavity to a minimum volume. The cavity is created using two concentric metallic shells, the inner shell being referred to as an "armature" since it will move outward, and an outer stationary shell known as a "stator." The inner shell is loaded with explosives, and held in position relative to the stator using metallic caps placed on each end. The space between the armature, stator, and end caps defines the volume associated with the cavity. Typically, the ratio of the radii of the two shells is slightly less than two, while the length to diameter ratio of the entire device is usually greater than one. Thus, a typical FCG has considerable cavity volume. The explosive may be initiated at the input end, while the other end is referred to as the output end. The input end cap inner radius is slightly smaller than that of the armature so that a small gap exists initially to feed current in and out of the two shells from an external source. A small radial gap also exists between the stator and the output end cap so that current can be directed outward into an external electrical load.

In operation, a relatively small amount of "seed" current from an external source is injected into the armature input end and returned from the input end of the stator. Thus, the flow of current is directed along the length of the armature, through the output end cap, continues into the external load circuit, and returns back through the stator and the input end cap to the external source. When a solid metallic stator is used (coaxial generator), the current flow establishes an azimuthally oriented "seed" magnetic field within the cavity. When the stator consists of helical windings (helical generator), current flow in the turns establishes a longitudinal "seed" magnetic field. Beyond that difference, the two types of FCGs operate in similar fashion.

After the "seed" current, and therefore the "seed" magnetic field has been established, the explosive is initiated at the input end. Thus, expansion of the detonated explosive causes the armature to begin to expand first at the input end and progressively down the armature length as the detonation wave travels toward the output end. The first motion of the armature is to cross the gap at the input end cap, make contact with the end cap, and cut the external seed current source out of the circuit so that the circuit now consists of the armature, the output end cap, the load, the stator, and the input end cap that is now in contact with the armature. Thus, the current and magnetic field are trapped within a closed volume represented by the FCG cavity together with the cavity of the electrical load. The armature continues to expand radially, reducing the FCG cavity volume to near zero when the output end of the armature collides with the output end of the stator.

During FCG function, the magnetic field, its associated pressure, and corresponding current are intensified as the cavity is collapsed. As the collapse process continues, the explosive driving the armature does work against the magnetic pressure and thereby converts its chemical energy released upon detonation to electrical energy. A nominal 40 mm diameter device with L/D (Length over Diameter)=1.5 FCG, using 3 thousand Amperes of seed current can produce 1.5 million Amperes of peak current delivered in about 10 microseconds. Thus, 1 kJ of electrical energy can be generated using an FCG having a volume of 100 $cm^3$. Using state-of-the-art capacitors having charge densities of 2.5 Jules/$cm^3$ would require a capacitor volume of 400 $cm^3$ to match the output of a FCG. Thus, there is a great advantage of using an FCG to create energy to initiate insensitive explosives using electrical driven impactors or hot wires as compared to using a storage capacitor for that purpose.

One example of a coaxial generator that can be employed in devices according to the invention is disclosed in: J. H. Goforth, et al, "The Ranchero Explosive Pulsed Power System," 11th IEEE International Pulsed Power Conference, Hyatt Regency, Baltimore Md., Jun. 29-Jul. 2, 1997. An example of a helical generator that can be employed in devices according to the invention is disclosed in: A. Neuber et al, "Compact High Power Microwave Generation," Proceedings of the Army Science Conference (26th), Orlando, Fla., 1-4 Dec. 2008. The disclosures of these publications are incorporated herein by reference.

To a first order, the peak FCG output current results from the starting inductances of both cavities relative to the final inductance of the system after magnetic compression. When the FCG cavity is completely collapsed, current gain is the ratio of the initial cavity inductance (FCG plus the load) to the final inductance represented by the load. Consequently for a typical FCG system having load inductance of 2 nanoHenries and FCG cavity of 4000 nanoHeneries the current gain is about 2000.

An advantage of the helical generator with its wire wound stator is that a much higher initial inductance can be obtained per unit length, but at the expense of added complexity. In contrast, the coaxial generator has a simpler construction, but with a considerably lower initial inductance. For well-designed generators of similar length, typical current gains are 10 to 12 for the coaxial types, and 2000 or more for a helical wound generators. Often, coaxial generators are used with much higher seed current to get high output current since premature electrical breakdown between wires and wire melting are not issues.

Work with explosively driven flux compression in the United States dates back to C. M. Fowler's work published in 1960: C. M. Fowler, W. B. Garn, and R. S. Caird, "Production of Very High Magnetic Fields by Implosion," *Journal of Applied Physics*, 31(3), 1960, pp. 588-594, incorporated herein by reference.

Since then, both coaxial and helical generators have been designed, built, and tested. The most notable groups examining helically wound generators include Los Alamos National Laboratory in Los Alamos, N. Mex., as disclosed in: C. M. Fowler and L. L. Altgilbers, "Magnetic Flux Compression Generators: a Tutorial and Survey," *Journal of Electromagnetic Phenomenon*, 3(11), 2003, pp. 305-357, the Kurchatov Institute of Atomic Energy in Moscow, S. Kassel, "Pulsed-Power Research and Development in the USSR," *R-2212-ARPA*, May 1978, and Texas Tech University in Lubbock, Tex., A. Neuber, et al, supra, all, incorporated herein by reference.

Notable patents pertaining to explosively driven flux compression devices with helically wound generators include U.S. Pat. No. 4,370,576, J. S. Foster and J. R Wilson, U.S. Pat. No. 3,356,869, J. L. Hilton and M. J. Morley, all incorporated herein by reference.

U.S. Pat. No. 4,370,576 details the operation of helically wound flux compression generators. J. L. Hilton et al's patent claims the use of complex winding patterns to enhance electrical efficiency for flux compression devices.

The ability to generate high levels of electrical energy from an FCG as related to the present invention allows for a safe and reliable means to initiate insensitive materials not only at a given point of the insensitive reactive material but also at multiple points within these materials. Thus, the present invention allows for multipoint initiation enabling tailorable effects in terms of munition fragmentation or blast output. Depending upon the target to be attacked, multipoint initiation can produce varying effects, i.e., enhance overall effectiveness, diminish munition output to provide control over collateral damage, or provide directed lethal output in given directions about the munition upon detonation.

While means exist to initiate explosive materials and to alter effects using multiple initiation sites within the explosives, no safe and reliable means is known when insensitive explosives are used as the main fill for munitions. Mainly, large booster systems or energy consuming electrical devices are required to assure initiation in these cases. The large booster systems in themselves compromise safety, whereas the electrical initiation approach requires undesired large electrical storage systems. Applications to weaponry have not been forthcoming because of these reasons. Use of an FCG as an energy source to power single point or multipoint initiation into detonation of insensitive materials has not been investigated previously.

There exists a need to initiate insensitive explosives in a safe and reliable manner, together with the ability to organize the initiation so that tailorable effects of munitions and weapons can be obtained. Such devices can integrate the FCG, loads, power supply, and initiators or detonators into a compact, autonomous package. With such device, sufficient energy is generated to initiate and sustain detonation in insensitive explosives and reactive materials. Prior state of the art initiation technology cannot accomplish this task in compact form. Essentially, the large boosters and/or large capacitors required prohibit their use as efficient, self-contained initiation systems. Further, multipoint initiation for tailorable effects cannot be accomplished since each initiation site would have to contain a sensitive explosive train together with a large sensitive booster, or the main power supply capacitor needed for slapper systems is far too large to be carried within the munition.

Although, conventional shaped charges and/or slapper detonators could possibly be used to initiate insensitive explosives, the energy sources become excessively large for either single point or multipoint initiation schemes. Further, safe and arming each and every initiator becomes a daunting task, which again involves inordinate amounts of space, volume, and weight. In addition, when a conventional explosive driven initiator is being used, there is no convenient means to avoid a catastrophic detonation of the main insensitive fill should the explosive within the initiator be accidentally detonated.

BRIEF SUMMARY OF THE INVENTION

The present invention overcomes many of these drawbacks.

The present invention uses a compact explosive device to produce large electrical currents that are used to power substantially large impactors in the form of a slapper detonator if desired, a flying plate, or a jet penetrator having sufficient energy to initiate insensitive high explosives directly. It can also power multiple ignition impactors or hot wires embedded in insensitive reactive materials. At the heart of the present invention is a flux compression generator (FCG) having a specially designed electrical load that creates kinetic energy or Joule heating in one of the above forms to initiate insensitive materials. The kinetic energy impactor or ignitor cannot be formed or energized unless a relatively small amount of "seed" current is applied to the FCG, therefore there is a built in means to safe, i.e., prevent detonation of, the munition even if the explosives of the FCG device, being secondary explosives, are accidentally initiated. Further, the individual initiators powered by electricity contain no explosives and are considered inert. This aspect represents an advantage over explosively loaded traditional initiators, slapper detonators, or conventional detonators in terms of safety.

An FCG acts as a highly compact source of electrical energy with sufficient capacity to power any number of highly energetic initiators to include kinetic energy impactors, slapper detonators, or hot wires. The electrical energy produced by the FCG can be distributed within the munition using electrical conduits of minimal size connected to a large number of initiators The explosives of the FCG and its initiator can be "safed" using standard electrical circuitry so that no additional burden is placed on the system from initiation of the FCG explosives. An additional safety aspect of the invention is that, given an accidental initiation of the FCG explosives by external stimuli, no output from the initiators to the main insensitive explosive can take place unless the FCG has been charged with seed current. The command to provide seed current can come from the electronic safe and arm circuitry in similar fashion as that for the command to arm and function the initiator of the FCG. Without full electrical output of the FCG, the associated initiators within the insensitive explosive cannot function. Without applied electrical current these initiators are essentially inert since they contain no explosives but rather rely an application of high current or voltage for their function.

Any and all of the aforementioned techniques can be combined into a single warhead configuration to produce a compact, safe, reliable, single point or multipoint initiation scheme. For tailorable effects, the conduits carrying the electrical current can be switched, on command, to activate all or subsets of the initiator arrays. Consequently, the warhead can be initiated in various ways depending on the nature of the target. Thus, aspects for maximizing lethality, or diminishing collateral damage, for example, can be managed. The technology is scalable and thus can be applied to various systems from small hand fired or placed devices to large missile warheads and projectiles. In total, therefore, the invention has advantages in terms of utility, costs, and performance over known approaches.

The present invention provides an initiator for insensitive explosives that includes the following components: 1) a flux compression generator with a generator explosive, 2) an initiation scheme to initiate the FCG explosive, 3) electrical loads that are initiators for the insensitive reactive material explosive, 4) output conduits that connect the FCG output to the initiator load(s), 5) a switching network to connect the conduits to all or various subsets of initiators, 6) an electronics package for producing a seed current for the FCG, and 7) a fuse switch to be activated upon munition interaction with the target. The electrical initiator loads can be of varied types to include hot wires, or kinetic energy impactors like slapper detonators, flying plates, and shaped charge jets.

The present invention provides a flux compression generator that is unified in that it utilizes components of helical and coaxial stator structures to provide additional energy to act on initiator sets.

The present invention allows a compact, multiple effect initiation system, that has redundant safety, by virtue of electric safe and arming controlling both initiation of the FCG explosives and application of seed current to the generator so as to act on initiators that in turn act on the insensitive explosives and reactive materials.

The present invention provides a greater amount of electrical energy in an efficient manner for converting explosive energy into mechanical energy associated with projection of kinetic energy as an impactor type initiator to act on the insensitive reactive materials and explosives.

The present invention provides means for selecting all or subsets of initiators acting on the insensitive fills to deliver full or limited lethality, or directed effects of the munition on a target.

DETAILED DESCRIPTION OF THE INVENTION

Figure 1:
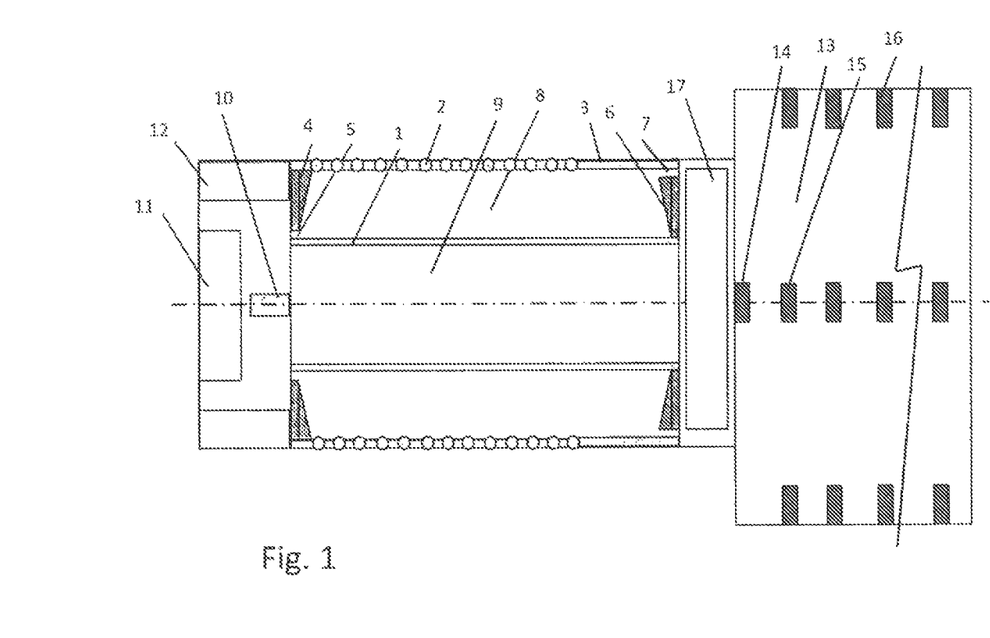
FIG. 1 is a cross-sectional view of one embodiment of the invention, which will be housed in a suitable projectile, or missile.

The basic components of an explosive device for powering electrical initiators according to the invention are shown in FIG. 1. The device includes a flux compression generator, electrical loads composed of initiators either of kinetic energy or hot wire types, a means to detonate the high explosives of the FCG, a means to distribute electrical energy to various initiators through a switching network, and an electronic unit to produce starting seed current for the generator.

As shown in FIG. 1, the FCG portion of the system has an electrically conducting armature 1, an outer stator 2 that includes helical wire windings and a coaxial section 3, an input end plate 4, an input insulated channel 5, an output end plate 6, and an output insulated channel 7. Channels 5 and 7 may be insulated with Mylar or Kapton material. Armature 1, stator 2, end plate 4, and end plate 6 form a cavity 8 that represents the inductance of the FCG. Armature 1 is filled with conventional explosives 9. Detonator 10 is used to initiate and detonate explosives 9. Power to activate detonator 10 is supplied by the combined action of a thermal battery 11 and a storage capacitor 12. The FCG provides electrical current and voltage to initiate insensitive explosive or reactive material fill 13. The initiation system for insensitive explosive fill 13 includes a detonator 14 as a single point, an axial detonator array 15, or peripheral detonator array 16. Detonator 14 and/or axial detonator array 15 and/or a peripheral detonator array 16 are connected to the FCG through a switching network 17.

Figure 2:
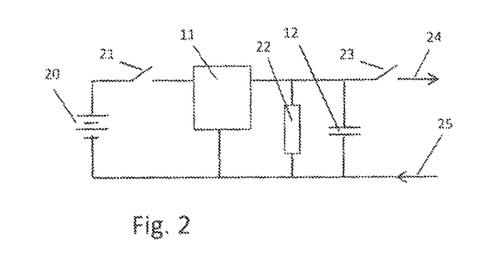
FIG. 2 is an electrical circuit that produces electricity to power the embodiment of the invention as illustrated in FIG. 1, which will be housed in a suitable projectile or missile.

FIG. 2 is a circuit diagram of an external power source that generates seed current to power the FCG. The circuit has a low level power source 20, switch 21 connected in series between power source 20 a thermal battery 11, a resistor 22 connected in parallel with battery 11, a capacitor 12 connected in parallel with resistor 22, output switch 23 connected in series with output lead 24, which is connected to armature 1, and return lead 25 connected to stator 2. A crowbar switch is formed by the input end of armature 1 and inner edge of input endplate 4, due to their proximity and is open initially as insulated channel 5. The function of this element will be described in further detail below.

Figure 3:
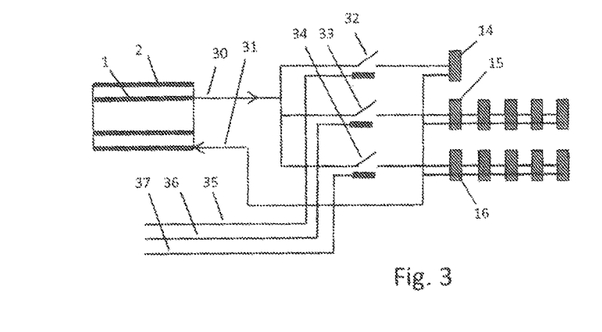
FIG. 3 is a diagram of an electrical circuit to switch current to various initiators according to the invention, which will be housed in a suitable projectile or missile.

FIG. 3 is a diagram of a circuit that switches FCG output current to initiators or detonators in the main explosive fill. An FCG output lead 30 is connected to armature 1, and a return lead 31 is connected to stator 2. A single point initiator solenoid switch 32, axial array initiator solenoid switch 33, and peripheral array initiator solenoid switch 34 are each connected between output lead 30 and corresponding detonators. The solenoid switches are actuated by solenoids driven by current supplied by respective ones of power lead 35 for solenoid switch 32, power lead 36 for solenoid switch 33, and power lead 37 for solenoid switch 34. A selected one of switches 32-34 will be actuated by a manual command.

Figure 4:
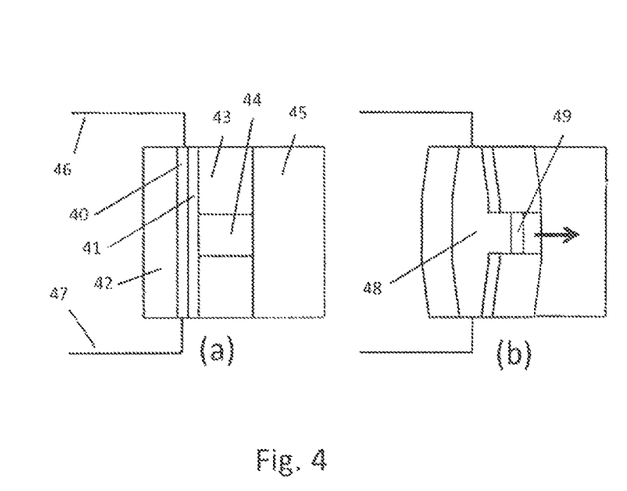
FIG. 4 is a slapper detonator device and components used in its construction, together with the formed projectile after application of electrical current.

FIGS. 4(a) and (b) illustrate the components of a slapper detonator that may be used as detonator 10 or detonator 14, 15, or 16. A thin metallic foil 40 and Mylar film 41 are sandwiched between backing material 42 and frontal material 43. Within the frontal material 43 is a cylindrical cavity 44 that functions as a gun barrel.

If this slapper detonator is used as detonator 10, then leads 46 and 47 will be connected across a series arrangement of a capacitor and a switch, and secondary explosive 45 will correspond to secondary explosive 9 of FIG. 1.

If this slapper detonator is used as detonator 14, 15, or 16, electrical lead 46 connects one side of the detonator to the output of the armature 1, while electrical lead 47 connects the other side of the detonator to the output end of the FCG stator 2. The current through foil 40 resulting from detonation of explosive 9 causes metallic foil 40 to explode, creating a cavity 48, and Mylar film 41 is converted into a projectile 49. Secondary explosives 45 may be contained within, and in one embodiment may be an integral part of, the slapper detonator and will initiate secondary explosive 13 of FIG. 1. Alternatively, secondary explosives 45 need not be an integral part of the slapper detonator If this slapper detonator is used as detonator 14, 15, or 16, and electrically connected to output ends of FCG armature 1 and stator 2, then explosives 45 may be the tertiary or insensitive reactive materials 13 of FIG. 1.

FIGS. 5(a) and (b) show components of another detonator according to the invention in the form of a flyer plate initiator. In this embodiment, a washer liner 50 is positioned between a central electrode 51 and a confinement stator 52. The central electrode 51, washer liner 50 and stator 52 form an electrical path about insulated channel 53. The electrical insulation material may be Mylar or Kapton. An electrical lead 54 connects to the output end of armature 1, while electrical lead 55 connects to the output end of stator 2. Current flow about cavity 53 and through central electrode 51, washer liner 50, and stator 52 causes washer liner 50 to form a flying plate in the form of washer projectile 56 and creates expansion cavity 57.

FIGS. 6(a) and (b) illustrate formation of a jet initiator according to the invention. A shaped charge liner 60 is sandwiched between a central electrode 61 and an outer stator 62. The central electrode 61, shaped charge liner 60, and stator 62 form an electrical path about insulated channel 63.

An electrical lead 64 is connected to the output end of FCG armature 1 and an electrical lead 65 is connected to the output end of FCG stator 2. Passage of current through central electrode 61, shaped charge liner 60, and stator 62 implodes liner 60 toward the device axis. Shaped charge liner 60 is shown in FIG. 6(b) midway through the collapse process as liner 67 produces the formation of jet initiator 68.

Figure 7:
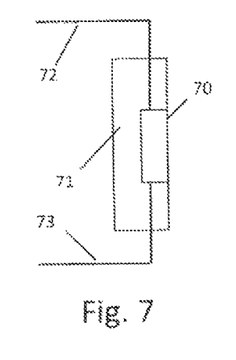
FIG. 7 is a hot wire initiator showing the associated components that comprise the initiator.

FIG. 7 is a detail of a hot wire initiator. Components include a heating element 70, base or casing 71, an electrical lead 72 connecting to the output end of armature 1, and an electrical lead 73 connecting to the output end of stator 2.

Figure 5:
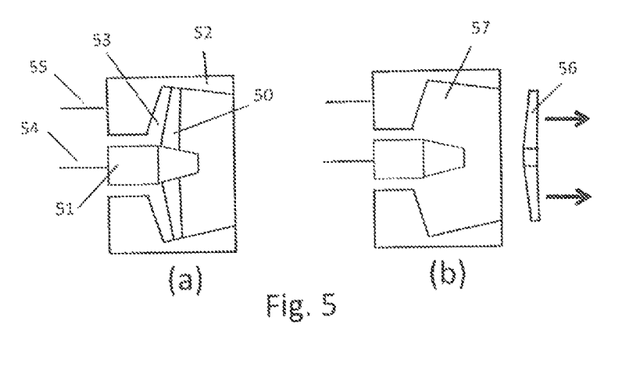
FIG. 5 is a flyer plate device according to the invention, together with the formed flyer plate after application of electrical current.
Figure 6:
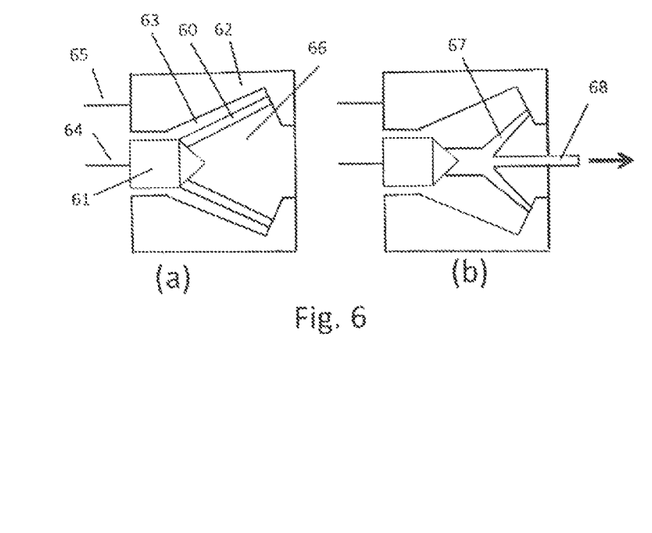
FIG. 6 is a shaped charge device according to the invention, together with an illustration of the formed jet after application of electrical current.

The embodiments shown in FIGS. 5, 6 and 7 may be used as detonators 14, 15, or 16 to detonate either secondary or insensitive (tertiary) explosives.

Figure 8:
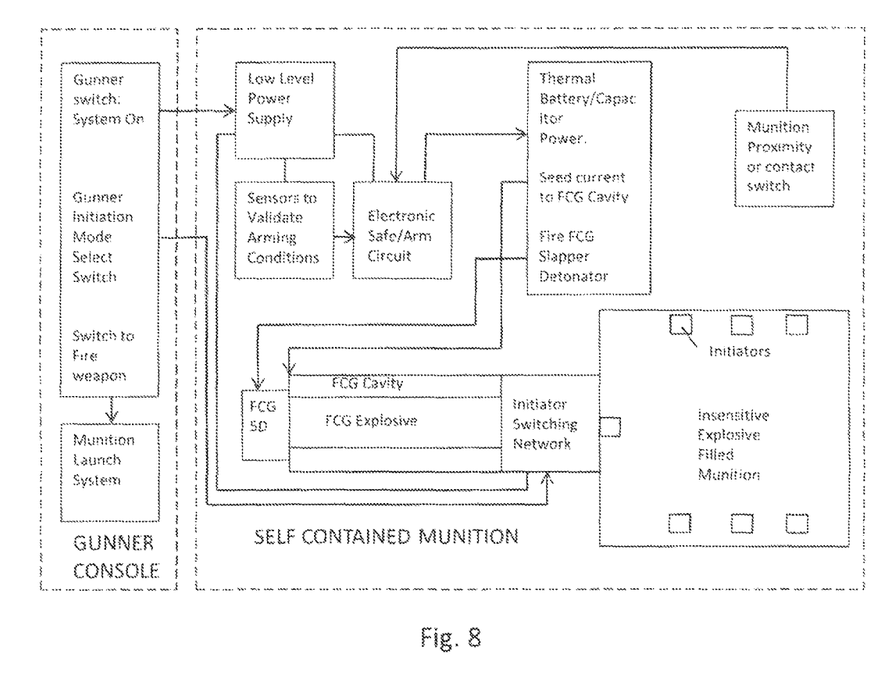
FIG. 8 is a schematic showing one form of construction of components according to the present invention.

Shown in FIG. 8 is a schematic diagram of a possible initiating system according to the invention. The system consists of two sections, i.e., one exterior to the self contained munition (the console used by the gunner), and a second system placed within the self contained munition.

The gunner console has a switch used by the gunner to power the system into a ready mode. It also has a means for the gunner to select the initiation mode, being in this example, either single point, axial, or peripheral. A third means is provided to launch the weapon by gunner command to the munition launch system. Within the self contained munition are placed a low level power supply, safe and arm mechanism or circuit, onboard safe condition verification module, munition proximity or contact switch, thermal battery/capacitor as a power generating source for seed current, initiator or detonator for the FCG explosives, a FCG, switching network, an insensitive reactive material/ explosive filled munition, and initiators or detonators distributed throughout the explosives or reactive materials of the munition.

In operation, a sequence of events begins with the gunner switch being switched to the "on" position. This switch closure signals the low-level power supply to furnish power to the various components within the self-contained munition. Thereafter, the gunner sets initiation mode select switch to one of the three settings provided in this example. The final function of the gunner and exterior console is to activate the switch to launch the weapon. Launch of the weapon separates the command system from the munition physically and electrically.

During munition launch, sensors aboard the munition validate that a proper launch has taken place and send a verification signal to the electronic safe and arm module. After the munition has reached a safe distance from the gunner and verification has taken place, the safe and arm (S&A) places the munition in the "armed" condition. The arming readies all circuits to function on a proper signal to detonate the munition, which comes from the proximity or contact switch. Closing of the contact switch instructs the S&A device to apply low-level power to ignite the thermal battery. Action of the thermal battery in time charges the capacitor. Then, the capacitor discharge into the FCG develops a seed current passing through the conductors of the FCG and seed magnet field in the FCG cavity by virtue of the current flow. Subsequently, an electrical pulse is delivered to the FCG detonator to initiate the FCG explosives.

Upon detonation of the FCG, according to FIG. 1, under the force of detonating FCG explosives 9, the input end of armature 1 initially travels radially across input gap 5, cuts through the insulation of gap 5, and makes electrical contact with input end plate 4. This action constitutes the function of a "crowbar" switch as known in the FCG art. The action of the crowbar switch cuts out the external power generating seed current circuit from the generator at the beginning of its function. During further expansion of armature 1, the input end of armature 1 slides with electrical contact along input end cap 4 until it reaches the input end of stator 2. Armature 1 makes successive contact, first with the input end of outer stator 2 and ultimately with the coaxial stator section 3 of stator 2. The action of armature 2 is to reduce the volume of FCG cavity 8, do work against the magnetic pressure contained within cavity 8, and amplify the current flowing through armature 1, end plate 6, load initiator(s), 14, 15 or 16, and allow the current to return to the armature through the stator 2 and input end plate 4.

The high level of current generated by the FCG and being applied to the initiators causes the initiators to function, which in turn initiates or detonates the insensitive explosives or reactive material 13 at the location of the single point initiator 14, or along the axis of axial initiator array 15, or at peripheral initiator array 16, for example. Mode switch 17 routes current produced by the FCG to the desired initiator (s). According to one example, solenoid switch 32 would be closed to cause single point initiator 14 to operate, while solenoid switch 33 or solenoid switch 34 would actuate axial initiator array 15 or peripheral initiator array 16, respectively. All solenoids or any one or any combination thereof could be activated to produce a multiplicity of initiator array function.

The initiators function in response to FCG output current flowing through their various components. For example, in FIG. 4, metallic foil 40 explodes using the exploding wire phenomenon, wherein passage of current through the metallic foil 40 via electrical leads 46 and 47 causes the foil's temperature to increase beyond the vapor phase in response to rapid Joule heating. The phase change causes expansion, which in turn, attempts to accelerate backing material 42 and frontal confinement 43. Since a portion of Mylar film 41 is not confined by virtue of its presence at cylindrical cavity 44, projectile 49 is formed by shearing out of Mylar film 41 and is propelled to extremely high velocity. Upon impact, projectile 49 has sufficient energy to initiate secondary explosives 45 of the slapper detonator while the output of the secondary explosives 45 can be sufficient to initiate insensitive explosives 13.

The function of the flying plate technique, according to the invention, is shown in FIG. 5. Flow of FCG output current through electrical leads 54 and 55, passes through central electrode 51, washer liner 50, stator 52, and returns through electrical lead 55. The action of current flowing in this circuit creates a very high magnetic field within the insulated channel 53. Interaction of the field and current produces an accelerating Lorentz force on washer liner 50 within an expanding cavity 57. Upon exit from the device body, washer liner 50 converts into flying plate 56, which impacts insensitive reactive material 13 (FIG. 1) with sufficiently large mass and high velocity to initiate detonation of such material. The cross section of the flying plate liner can be of varied shape to include conic sections, trumpet, hemispherical cap, or freely formed depending on the desired structure of the flying plate to be formed.

FIG. 6 shows shaped charge liner 60 wherein electrical current from the FCG through electrical lead 64 is passed about insulated channel 63 and through the central electrode 61, through the liner 60, through stator 62, and returned to the FCG through electrical lead 65. The current flow establishes a magnetic field whereby Lorentz forces accelerate liner 60 toward the device axis passing through cavity 66. As liner 60 strikes the axis some of its material flows forward to form jet penetrator 68. Jet penetrator 68 has high velocity and relatively high mass that provides a means to initiate insensitive reacting materials 13. The jet can have great length; therefore impact pressure can be sustained over a relative long time to assure initiation of insensitive reacting materials. The shaped charge liner 60 cross-section can have varied shape to include conic sections, tulip, trumpet, or be freely varied depending on the formed penetrator structure desired.

The hot wire initiator consists of a resistive element 70, base or encasement 71, and electrical leads 72 and 73 to provide electrical current to the resistive element 70. The element can be a coil of finely stretched metal such as tungsten or a solid section of high electrical resistance metal like Nichrome. When large currents are passed through the resistive element, its temperature rises by Joule heating. In application, the resistive element 70 is in contact with or embedded in insensitive reactive material 13. The temperature is sufficiently high to cause ignition or initiation of the insensitive reactive material.

Exemplary materials for the above described components may include conducting metals such as copper or aluminum for armature 1, wires for stator 2, coaxial section 3, and input and output end plates 4 and 6. For the initiators, copper, aluminum, tungsten or any electrically conducting metal can be used for flying plate liner 50, central electrode 51, stator 52, shaped charge liner 60, central electrode 61, and stator 62, for example. Typically, conventional primary explosive fills for the FCG explosives 9 can be TNT, Comp B, Octol or HMX based Plastic Bonded Explosives (PBXs). The initiation system addresses insensitive materials such as TATB (triaminotrinitrobenzene) and derivatives based on TATB. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

REFERENCES

1. Ordnance Explosive Train Designers' Handbook, NOLR 1111, 1952.
2. www.teledynerisi.com RP-95 EFI Detonator Data Sheet
3. www.excelitas.com DATASHEET Blue Chip Detonator
4. www.excelitas.com Electronic Safe, Arm and Fire Devices and Modules
5. MIL-STD-1316E, Fuze Design, Safety Criteria for DOD, 10 Jul. 1998.
6. T. R. Gibbs and A. Popolato, Eds., *LASL EXPLOSIVE PROPERTY DATA*, University of California Press, Berkley, C A, 1980.
7. J. Goldwasser, DARPA DSO, www.darpa.mil/Our_Work/DSO/Programs/Reactive_Material_Structures_(RMS) .aspx, April 2015.
8. T. P. Weihs, Johns Hopkins University, Woodhead Publishing Limited, Chapter 5, p. 160, 2014.
9. J. S. Foster, Jr., U.S. Pat. No. 4,370,576, issued on Jan. 25, 1983.
10. F. I. Grace, et al, U.S. patent application Ser. No. 13/949,849, filed on 24 Jul. 2013.
11. C. M. Fowler and L. L. Altgilbers, "Magnetic Flux Compression Generators: a Tutorial and Survey," *Journal of Electromagnetic Phenomenon*, 3 (11), 2003, pp. 305-357.
12. J. H. Goforth, et al, "The Ranchero Explosive Pulsed Power System," $11^{th}$ IEEE International Pulsed Power Conference, Hyatt Regency, Baltimore Md., Jun. 29-Jul. 2, 1997.
13. A. Neuber, et al, "Compact High Power Microwave Generation," *Proceedings of the Army Science Conference* (26th), Orlando, Fla., 1-4 Dec. 2008.
14. C. M. Fowler, W. B. Garn, and R. S. Caird, "Production of Very High Magnetic Fields by Implosion," *Journal of Applied Physics*, 31(3), 1960, pp. 588-594.
15. Kurchatov Institute of Atomic Energy in Moscow, S. Kassel, "Pulsed-Power Research and Development in the USSR," *R-2212-ARPA*, May 1978, and Texas Tech University in Lubbock, Tex., A. Neuber, et al, supra.
16. J. L. Hilton and M. J. Morley, U.S. Pat. No. 3,356,869.

What is claimed is:

1. A device for initiating an explosive, propellant, or reactive material, said device comprising:
   a flux compression generator operative to produce a high intensity electric current when activated;
   a first electrical circuit connected to produce a seed current that powers said flux compression generator in order to generate the high intensity electric current; and
   an electrical payload connected to said generator and constructed to receive the high intensity electric current and cause energy in the current to generate a projectile in the payload to initiate reaction of the explosive, propellant, or reactive material;
   wherein said first electrical circuit comprises a thermal battery constituting a source for providing the seed current.

2. The device according to claim 1, further comprising a second electrical circuit connected to receive commands to operate said generator and to direct electrical current to the payload.

3. The device according to claim 1, wherein said electrical payload comprises a component constructed to generate and launch a plate projectile.

4. The device according to claim 1, wherein said electrical payload comprises a component constructed to generate and launch a shaped projectile.

5. The device according to claim 1, wherein said electrical payload comprises multiple components constructed to generate single and multiple shaped projectiles.

6. The device according to claim 5, wherein said components are connected to said generator, and said electrical payload further comprises a switch member between said generator and said components operative to first direct the high intensity electric current to said components to produce plate, or shaped, projectiles and to then direct the projectiles at an explosive target.

7. The device according to claim 5, wherein said components are connected to said generator, and said electrical payload further comprises a switch member between said generator and said components operative to first direct the high intensity electric current to said components to supply electrical energy to detonators to initiate explosives.

8. The device according to claim 1, wherein said electrical payload is distributed throughout insensitive reactive materials to initiate said insensitive reactive materials at a multiplicity of sites within the said insensitive reactive materials.

9. The device of claim 1, wherein said flux compression generator is constructed to power at least one detonator selected from the group consisting of standard detonators, slapper detonators, and said payload.

10. The device of claim 1, wherein said payload is a component of an explosive train to transfer energy to primary or secondary explosives or insensitive reactive materials.

11. The device of claim 1, wherein said flux compression generator and said payload are controlled by mechanical out of line safe arm devices or electronic in line safe arm devices.

12. The device of claim 1, wherein operation of said flux compression generator is initiated by a detonator.

13. The device according to claim 1, wherein said flux compression generator has an axially symmetrical form with a longitudinal axis and comprises:
   an annular shell containing high explosives;
   an annular armature surrounding said annular shell; and
   an annular stator assembly surrounding said armature and spaced from said armature by an electrical insulating medium; and
   wherein the seed current that flows through said armature and said stator assembly in series to initiate the reaction of the explosive, propellant, or reactive material after the seed current has been established in order to generate the high intensity electric current.

14. The device according to claim 13, wherein said annular stator assembly comprises a first stator member composed of a helical coil of electrically conductive material and a second stator member composed of a solid cylinder of electrically conductive material, said first and second stator members being electrically connected to one another in series and being spaced apart along said longitudinal axis.

15. The device according to claim 14, wherein said first stator member comprises at least two sections space apart along the longitudinal axis of said flux compression generator, said first section comprising at least one wire extending from an ignition end of said device, and said second section being connected in series between said first section and said second stator member, said second section being composed of a plurality of wires each connected in series with said at least one wire, the number of wires in said second section being larger than the number of wires in said first section.

16. The device according to claim 13, wherein said armature is a unitary body that is axially coextensive with said first and second stator members.

17. The device according to claim 13, wherein said flux compression generator further comprises a munition enclosed by said annular shell and including a detonator that is actuated by said first electrical circuit.

18. The device according to claim 16, wherein said flux compression generator further comprises an annular buffer layer between said munition and said annular shell.

19. The device according to claim 1, wherein said electrical payload is configured to cause the current from said flux compression generator to generate Lorentz forces that accelerate the projectile toward the explosive, propellant, or reactive material.

20. A device for initiating an explosive, propellant, or reactive material, said device comprising:
   a flux compression generator operative to produce a high intensity electric current when activated; and
   an electrical payload connected to said generator and constructed to receive the high intensity electric current and cause energy in the current to generate a projectile in the payload to initiate reaction of the explosive, propellant, or reactive material,
   wherein said electrical payload is configured to cause the current from said flux compression generator to generate Lorentz forces that accelerate the projectile toward the explosive, propellant, or reactive material.

* * * * *